United States Patent
Li et al.

(10) Patent No.: US 8,421,137 B2
(45) Date of Patent: Apr. 16, 2013

(54) MAGNETIC RANDOM ACCESS MEMORY

(75) Inventors: Xia Li, San Diego, CA (US); Seung H. Kang, San Diego, CA (US); Xiaochun Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 3558 days.

(21) Appl. No.: 12/769,353

(22) Filed: Apr. 28, 2010

(65) Prior Publication Data

US 2010/0207221 A1   Aug. 19, 2010

Related U.S. Application Data

(62) Division of application No. 12/164,357, filed on Jun. 30, 2008, now Pat. No. 7,776,623.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl.
USPC .............. 257/295; 257/296; 257/E21.304; 257/E21.367; 257/E21.547; 257/E21.645; 257/E21.665

(58) Field of Classification Search ............ 257/295, 257/296, 314, 315, 316, 320, 649, 671, E21.367, 257/E21.304, E21.547, E21.645, E21.665
See application file for complete search history.

(56) References Cited

U.S. PATENT DOCUMENTS

| | | |
|---|---|---|
| 5,173,151 A | 12/1992 | Namose |
| 5,312,512 A | 5/1994 | Allman et al. |
| 6,117,798 A | 9/2000 | Fang |
| 7,071,009 B2 | 7/2006 | Wang |
| 7,122,386 B1 | 10/2006 | Torng |
| 7,368,299 B2 | 5/2008 | Lee |

(Continued)

FOREIGN PATENT DOCUMENTS

| | | |
|---|---|---|
| CN | 1490848 A | 4/2004 |
| EP | 0462730 | 12/1991 |
| EP | 0469401 | 2/1992 |
| EP | 1385197 | 1/2004 |

OTHER PUBLICATIONS

Gallagher, "Development of the Magnetic Tunnel Junction MRAM at IBM: From First Junctions to a 16-MB MRAM Demonstrator Chip," IBM J. Res & Dev. vol. 50 No. 1 Jan. 2006, 0018-8646/06 2006 IBM.
International Search Report—PCT/US09/048281, Internatioanl Seach Authority—European Patent Office Sep. 17, 2009.

(Continued)

*Primary Examiner* — David Nhu
(74) *Attorney, Agent, or Firm* — Sam Talpalatsky; Nicholas J. Pauley; Jonathan T. Velasco

(57) ABSTRACT

A device includes a magnetic tunnel junction (MTJ) structure and a cap layer in contact with the MTJ structure. The device also includes a spin-on material layer in contact with a sidewall portion of the cap layer and a conducting layer in contact with at least the spin-on material layer and a portion of the MTJ structure. The cap layer has been etched to expose a portion of an electrode contact layer of the MTJ structure. The conducting layer is in electrical contact with the exposed portion of the electrode contact layer of the MTJ structure.

24 Claims, 13 Drawing Sheets

U.S. PATENT DOCUMENTS

| | | |
|---|---|---|
| 7,602,032 B2 | 10/2009 | Klostermann |
| 7,776,623 B2 * | 8/2010 | Li et al. .............................. 438/3 |
| 2005/0221511 A1 | 10/2005 | Wang et al. |
| 2006/0014305 A1 | 1/2006 | Lee et al. |
| 2006/0245116 A1 | 11/2006 | Klostermann et al. |
| 2007/0164265 A1 | 7/2007 | Kajiyama |
| 2008/0296711 A1 | 12/2008 | Kyler et al. |

OTHER PUBLICATIONS

Written Opinion—PCT/US09/048281, Internatioanl Seach Authority—European Patent Office Sep. 17, 2009.

* cited by examiner

MAGNETIC RANDOM ACCESS MEMORY

I. CLAIM OF PRIORITY

The present application claims priority from and is a divisional of U.S. patent application Ser. No. 12/164,357 filed on Jun. 30, 2008, now U.S. Pat. No. 7,776,623, and entitled "system and method to fabricate magnetic random access memory," the contents of which are expressly incorporated herein by reference in their entirety.

II. FIELD

The present disclosure is generally related to magnetic random access memory.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Reducing power consumption has led to smaller circuitry feature sizes and operating voltages within such portable devices. Reduction of feature size and operating voltages, while reducing power consumption, also increases sensitivity to manufacturing process variations. Fabrication techniques that increase reliability of memory devices with reduced feature size are therefore desirable.

IV. SUMMARY

In a particular embodiment, a method includes depositing a cap layer on a magnetic tunnel junction (MTJ) structure. The method further includes depositing a first spin-on material layer over the cap layer and etching the first spin-on material layer and at least a portion of the cap layer.

In another particular embodiment, a device includes a magnetic tunnel junction (MTJ) structure and a cap layer in contact with the MTJ structure. The device also includes a spin-on material layer in contact with a sidewall portion of the cap layer and a conducting layer in contact with at least the spin-on material layer and a portion of the MTJ structure. The cap layer has been etched to expose a portion of an electrode contact layer of the MTJ structure. The conducting layer is in electrical contact with the exposed portion of the electrode contact layer of the MTJ structure.

In another particular embodiment, the device is formed by depositing a cap layer on an MTJ structure and depositing a spin-on material layer over the cap layer. The device is further formed by etching the spin-on material layer and at least a portion of the cap layer.

In another particular embodiment, the device is formed by depositing a cap layer on an MTJ structure and selecting one of a convex profile and a concave profile of the first spin-on material layer. The device is further formed by depositing the first spin-on material layer over the cap layer and etching the first spin-on material layer and at least a portion of the cap layer.

One particular advantage provided by at least one of the disclosed embodiments to fabricate magnetic random access memory is an improved yield. Another particular advantage provided by at least one of the disclosed embodiments is improved reliability of a magnetic random access memory.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
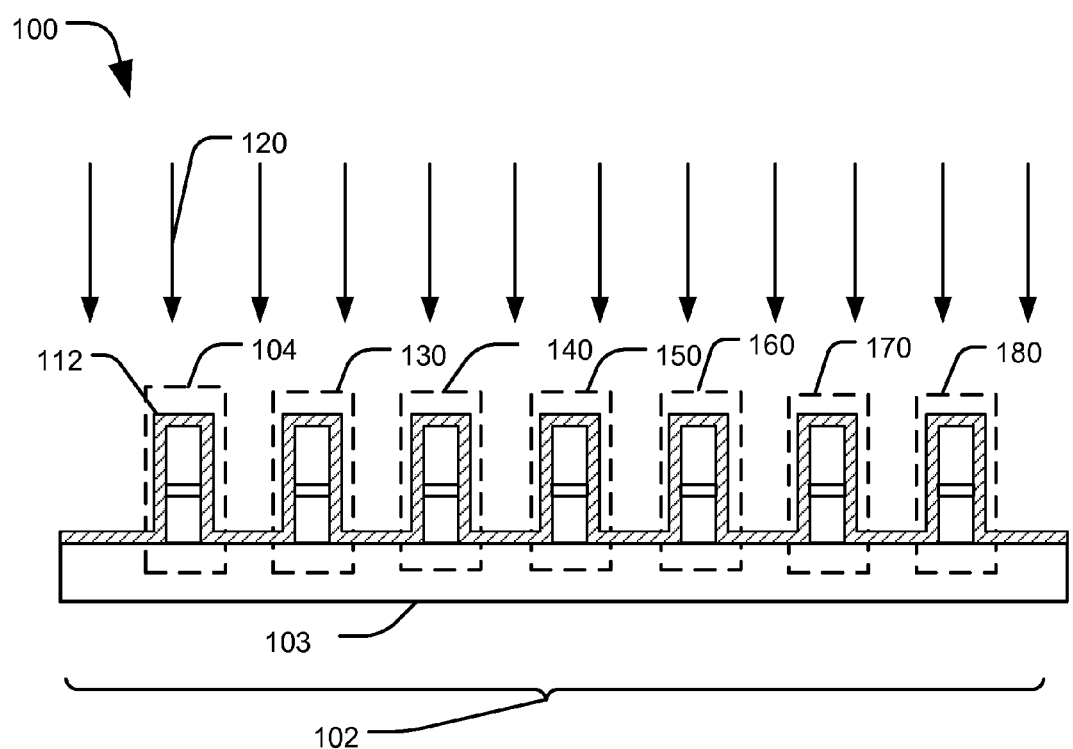
FIG. 1 is a cross-sectional diagram of a particular illustrative embodiment depicting deposition of a cap layer of a magnetic random access memory in fabrication.

Referring to FIG. 1, a particular illustrative embodiment depicting deposition of a cap layer of a magnetic random access memory in fabrication is generally designated 100. A magnetic random access memory 102 is fabricated on a substrate 103 and includes a plurality of magnetic tunnel junction structures (MTJs) including representative MTJs 104, 130, 140, 150, 160, 170, and 180. A material 120 being deposited on the magnetic random access memory 102 forms a cap layer 112. In a particular illustrative embodiment, the material 120 is silicon nitride, silicon carbide, or another electrically insulating material, or a combination of materials. In fabricating the magnetic random access memory 102, deposition of the material 120 typically occurs prior to deposition of an interlayer dielectric layer and a protective spin-on material layer.

Figure 2:
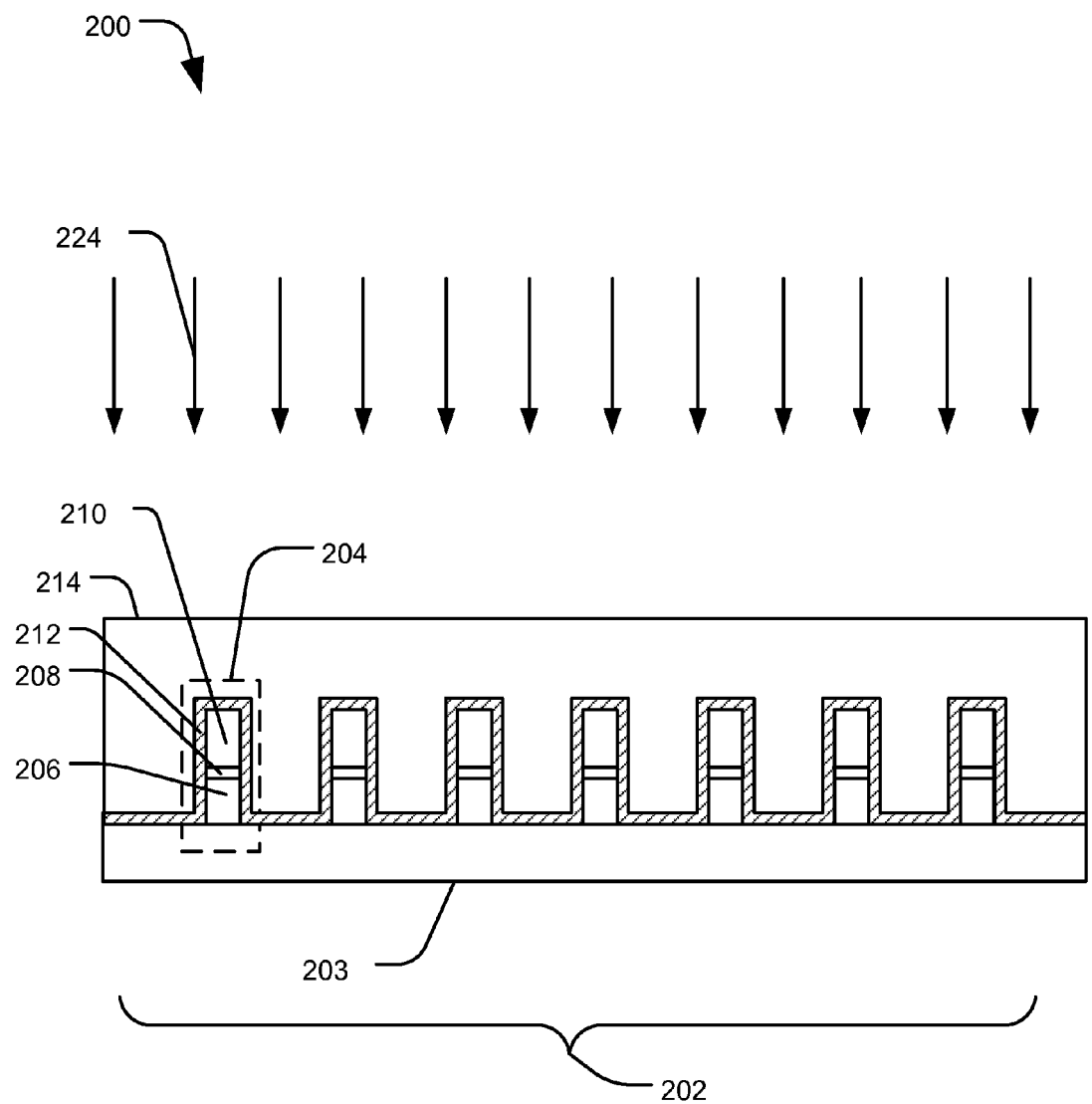
FIG. 2 is a cross-sectional diagram of a particular illustrative embodiment depicting deposition of an interlayer dielectric (ILD) of a magnetic random access memory in fabrication.

Referring to FIG. 2, a cross-sectional diagram of a particular illustrative embodiment depicting deposition of an interlayer dielectric (ILD) of a magnetic random access memory in fabrication is depicted and generally designated 200. An MRAM 202 has been partially formed on a substrate 203. The MRAM 202 includes a plurality of magnetic tunnel junction (MTJ) cells including MTJ 204. The MTJ 204 includes a lower ferromagnetic layer 206 (also called a "fixed layer" or a "pinned layer" herein), a tunneling barrier 208, and a top electrode contact layer 210 (also "ferromagnetic free layer" or "free layer" herein). The MTJ 204 is substantially surrounded by a cap layer 212 that may cover the substrate 203. The MTJ 204 may be surrounded by an interlayer dielectric (ILD) layer 214 formed by depositing an interlayer dielectric (ILD) material 224 over the cap layer 212. The deposition of the interlayer dielectric material 224 may be accomplished by e.g., chemical vapor deposition, physical vapor deposition, or by another deposition technique. In a particular illustrative example the interlayer dielectric material 224 may be silicon oxide or another electrically insulating material.

Figure 3:
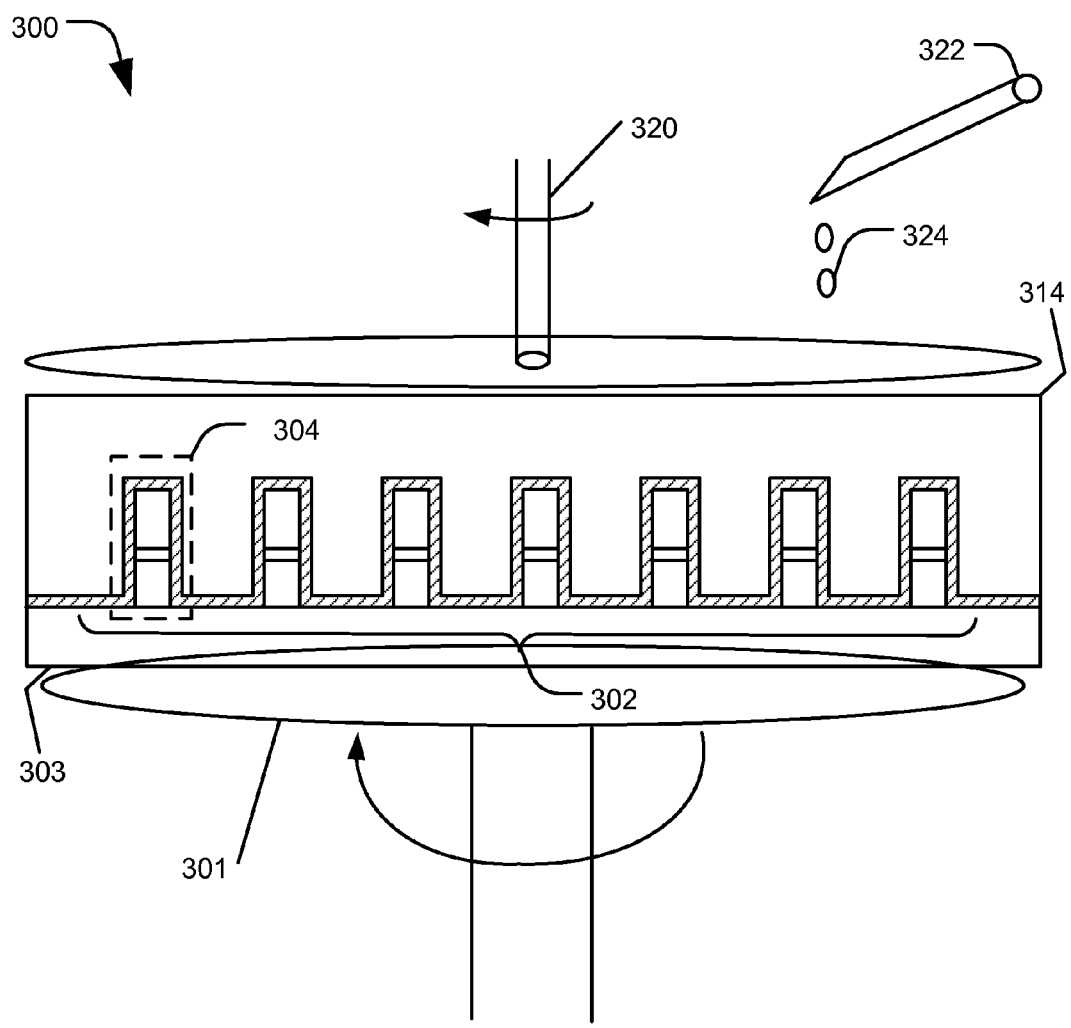
FIG. 3 is a cross-sectional diagram of a particular illustrative embodiment depicting a chemical-mechanical planarization (CMP) of a magnetic random access memory in fabrication.

Referring to FIG. 3, a cross-sectional diagram of a particular illustrative embodiment depicting a chemical-mechanical planarization (CMP) of a magnetic random access memory in fabrication is shown and generally designated 300. In a particular embodiment, FIG. 3 depicts a CMP stage of fabrication of the MRAM 202 of FIG. 2. A magnetic random access memory 302 includes a plurality of MTJ cells, such as MTJ cell 304. Each of the MTJ cells is surrounded by ILD material forming an ILD layer 314, and each of the MTJ cells is covered by the ILD layer 314. The MRAM 302, fabricated on a substrate 303, is placed on a mounting apparatus 301 that is rotatable. A chemical dispenser 322 may dispense a chemical 324 to be used in a planarizing process. A mechanical planarizing apparatus 320 that is rotatable may be used in conjunction with the dispensed chemical 324 to planarize an upper portion of the MRAM 302 including the ILD layer 314.

Figure 4:
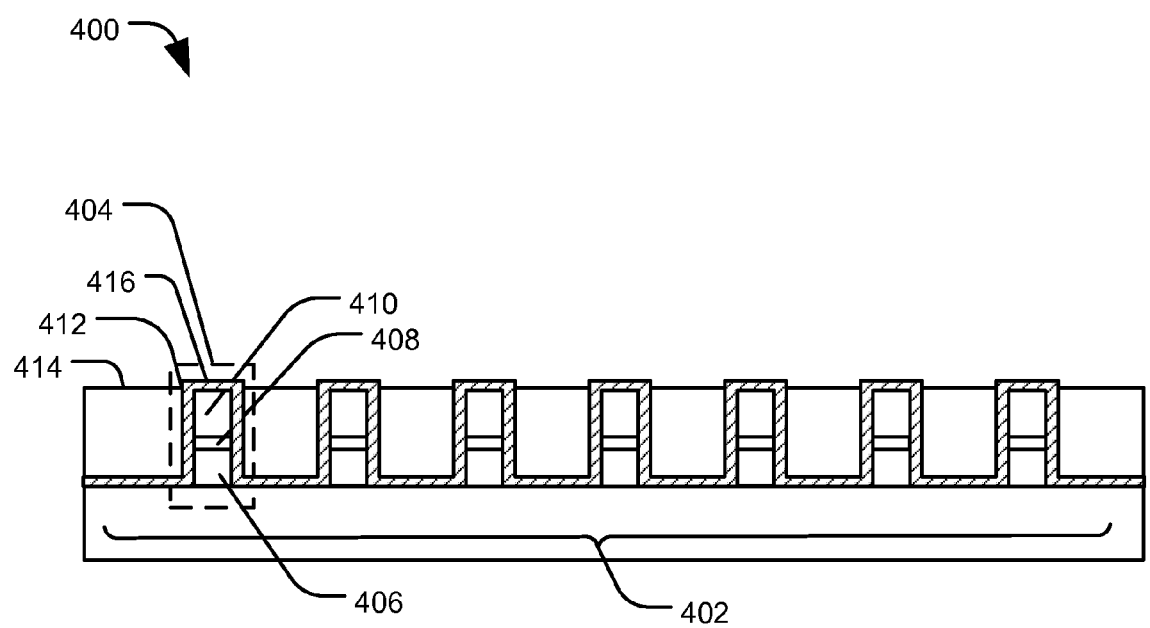
FIG. 4 is a cross-sectional diagram of a particular illustrative embodiment of a magnetic random access memory in fabrication.

Referring to FIG. 4, a cross-sectional diagram of a particular illustrative embodiment of a magnetic random access memory in fabrication is depicted and generally designated 400. In a particular embodiment, FIG. 4 depicts a post-planarization stage of fabrication of the MRAM 202 of FIG. 2. A magnetic random access memory 402 in fabrication includes a plurality of MTJs, such as MTJ 404. The MRAM 402 has been planarized, through, e.g., chemical-mechanical planarization as depicted in FIG. 3, or via another planarization technique. A cap layer 412 protects internal portions of the MTJ 404, including a top electrode contact layer portion 410, a tunneling barrier 408, and a pinned layer 406. As a result of planarization, an ILD layer 414 surrounding the cap layer 412 has been partially removed, exposing an uppermost cap layer portion 416 of the cap layer 412. During a subsequent etch procedure the cap layer 412, which is typically made of a different material than the ILD layer 414, may etch at a slower rate than the ILD layer 414. Without an additional protective layer, recession of the ILD layer 414 around each MTJ may occur during the etch procedure.

Figure 5:
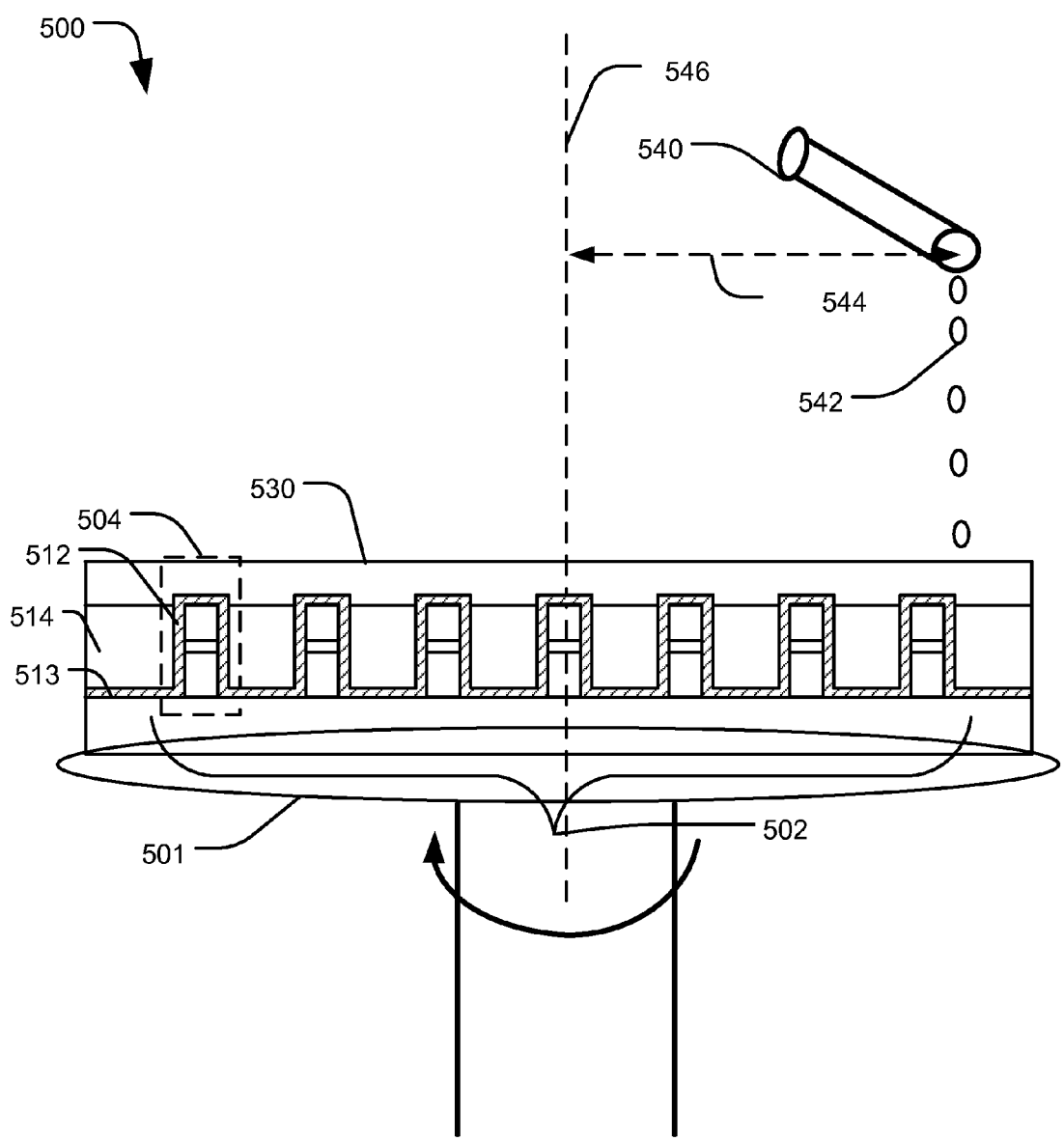
FIG. 5 is a cross-sectional diagram of a particular illustrative embodiment depicting deposition of a spin-on material (SOM) layer of a magnetic random access memory in fabrication.

Referring to FIG. 5, a cross-sectional diagram of a particular illustrative embodiment depicting deposition of a spin-on material (SOM) layer of a magnetic random access memory in fabrication is generally designated 500. In a particular embodiment, FIG. 5 depicts an SOM deposition stage of fabrication of the MRAM 202 of FIG. 2. An MRAM 502 includes a plurality of MTJs, such as MTJ 504. The MRAM 502 may be disposed on a support structure 501 that is rotatable. An SOM dispenser 540 may be positioned radially relative to the support structure 501, measured by a radial distance 544 from an axis of rotation 546 of the support structure 501. The SOM dispenser 540 may dispense spin-on material (SOM) 542 while the support structure 501 is rotating. Rotational angular acceleration and angular speed of rotation of the support structure 501 can be adjusted. The radial distance 544 may be varied during deposition, enabling the spin-on material to be deposited across an upper portion of the MRAM 502. Adjusting the rotational angular acceleration and the angular speed of rotation of the support structure 501 can change a thickness profile (also called radial profile herein) and a thickness uniformity of an SOM layer 530 deposited. By varying the radial distance 544 during deposition of the SOM 542 the SOM layer 530 may be formed that covers an ILD layer 514 and a cap layer 512, both of which have been previously deposited with the ILD layer 514 situated between a bottom portion of the cap layer 513 and the SOM layer 530.

A radial profile of the SOM layer 530, i.e., thickness of the SOM layer 530 as a function of distance from a center of the MRAM 502, may be pre-determined by selecting a profile of dispenser radial speed as a function of time. For example, selecting a uniform radial speed of the SOM dispenser 540 to dispense SOM at a substantially constant rate as the support structure 501 rotates may produce an SOM layer 530 with substantially uniform thickness. In another particular illustrative embodiment, selecting a non-uniform radial speed of the dispenser 540 during rotation of the support structure 501 may produce a non-uniform profile, such as a concave-shaped profile or a convex-shaped profile, as illustrative, non-limiting examples. After dispensing of the SOM 542 is complete, adjusting the angular speed of rotation and the rotational angular acceleration of the support structure 501 can also modify the radial profile and thickness uniformity of the SOM layer 530.

Figure 6:
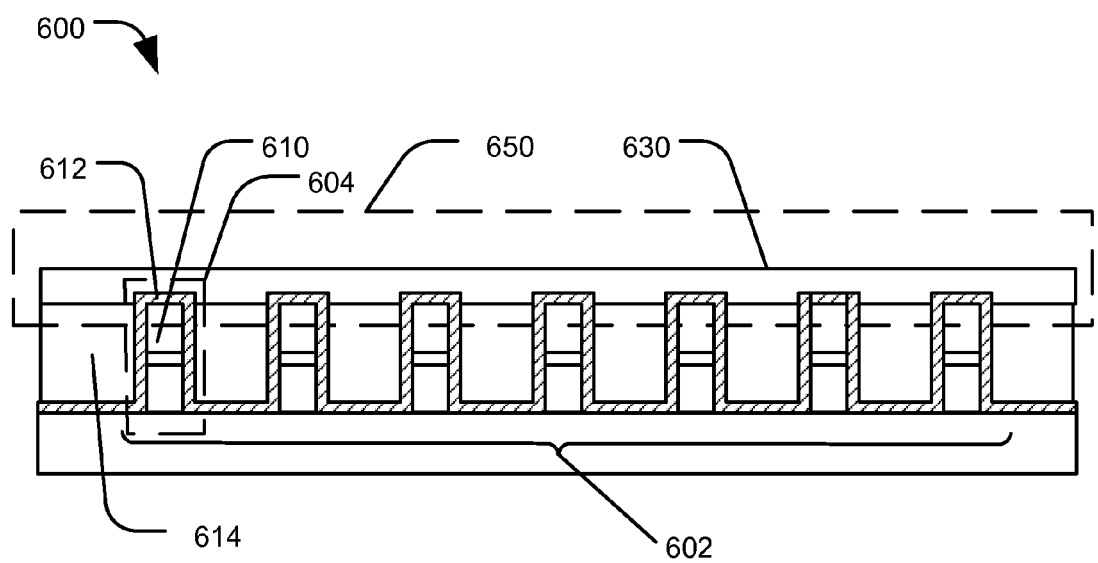
FIG. 6 is a cross-sectional diagram of a particular illustrative embodiment depicting etching of a spin-on material layer and a cap layer of a magnetic random access memory in fabrication.

Referring to FIG. 6, a cross-sectional diagram of a particular illustrative embodiment depicting etching of a spin-on material layer and a cap layer of a magnetic random access memory in fabrication is shown and generally designated 600. In a particular embodiment, FIG. 6 depicts an etching stage of fabrication of the MRAM 202 of FIG. 2. An MRAM 602 includes a plurality of MTJs, such as MTJ 604, and may be subjected to an etch procedure, such as a dry etch or a wet etch, which may be performed by immersing of a portion of the MRAM 602 in a chemical etching chamber 650. Prior to the etch procedure a cap layer 612, an ILD layer 614, and an SOM layer 630 have been deposited over a top electrode contact layer portion 610. A top electrode contact layer portion 610 of the MTJ 604 may be protected from the chemical etching chamber 650 during the etch procedure by the cap layer 612. During the etch procedure, portions of the SOM layer 630 may be etched, and when portions of the cap layer 612 become exposed to the chemical etching chamber 650 the exposed portions of the cap layer 612 may be etched as well. The SOM layer 630 may serve to protect the ILD layer 614 from being etched by the chemical etching chamber 650. The SOM layer 630 may also protect the cap layer 612 from being etched. After etching a portion of the SOM layer 630, a portion of the cap layer 612 may be exposed to the chemical etching chamber 650. Unetched portions of the SOM layer 630 may continue to protect the ILD layer 614 from the chemical etching chamber 650.

Figure 7:
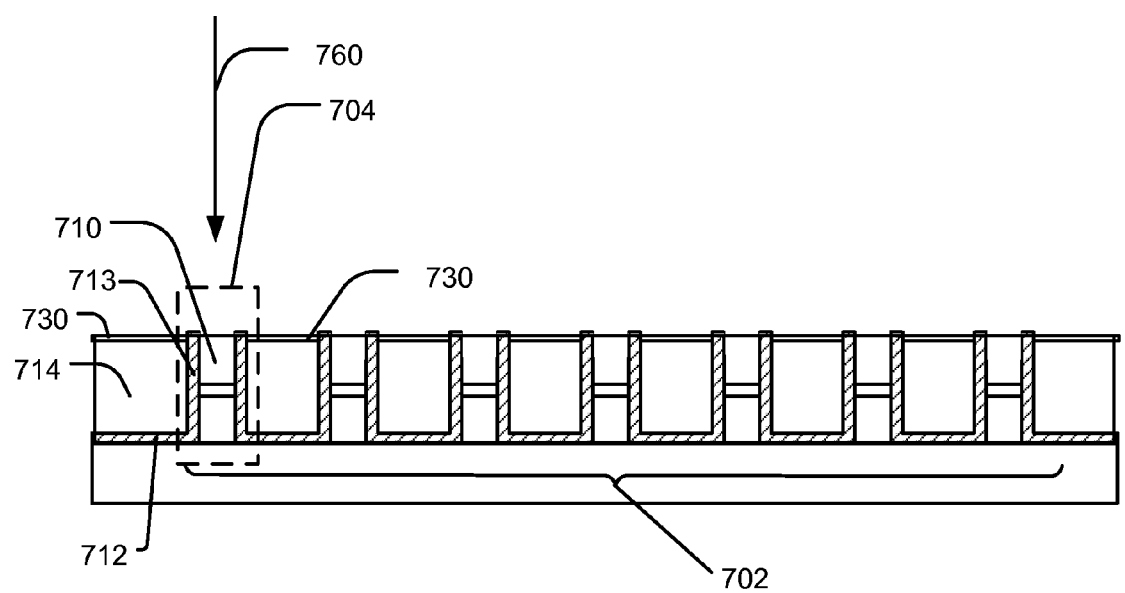
FIG. 7 is a cross-sectional diagram of a particular illustrative embodiment depicting a random access memory after etching of the spin-on material layer and the cap layer during fabrication.

Referring to FIG. 7, a cross-sectional diagram of a particular illustrative embodiment depicting a random access memory after etching of the spin-on material layer and the cap layer during fabrication is depicted. In a particular embodiment, FIG. 7 depicts a post-etching stage of fabrication of the MRAM 202 of FIG. 2. An MRAM 702 includes a plurality of MTJs, such as MTJ 704. A portion of a cap layer 712 has been etched away to expose a top electrode contact portion 710 of the MTJ 704. An ILD layer 714 may be protected by portions of an SOM layer 730 during an etching stage of fabrication. The ILD layer 714 can remain intact and may provide structural support to a sidewall portion 713 of the cap layer 712. The top electrode contact portion 710 of the MTJ 704 may subsequently be placed in contact with a conducting layer (not shown). In similar fashion, each of the MTJs of the MRAM 702 may have a portion of the cap layer 712 removed to expose a top electrode contact portion (also "top electrode contact window" herein) of the corresponding MTJ. Opening of the top electrode contact portion of MTJ can be detected by a visual inspection or by use of an electrical probe, such as an electrical probe 760, making electrical contact with the top electrode portion 710 of the MTJ 704.

A corresponding top electrode contact portion of each MTJ may subsequently be placed in contact with the conducting layer. The conducting layer (not shown) can be patterned to separate each MTJ from neighboring MTJs. A particular top electrode contact portion of an MTJ may be connected to a conducting layer. The conducting layer may be connected to routing metal wire to make a connection (not shown).

Figure 8:
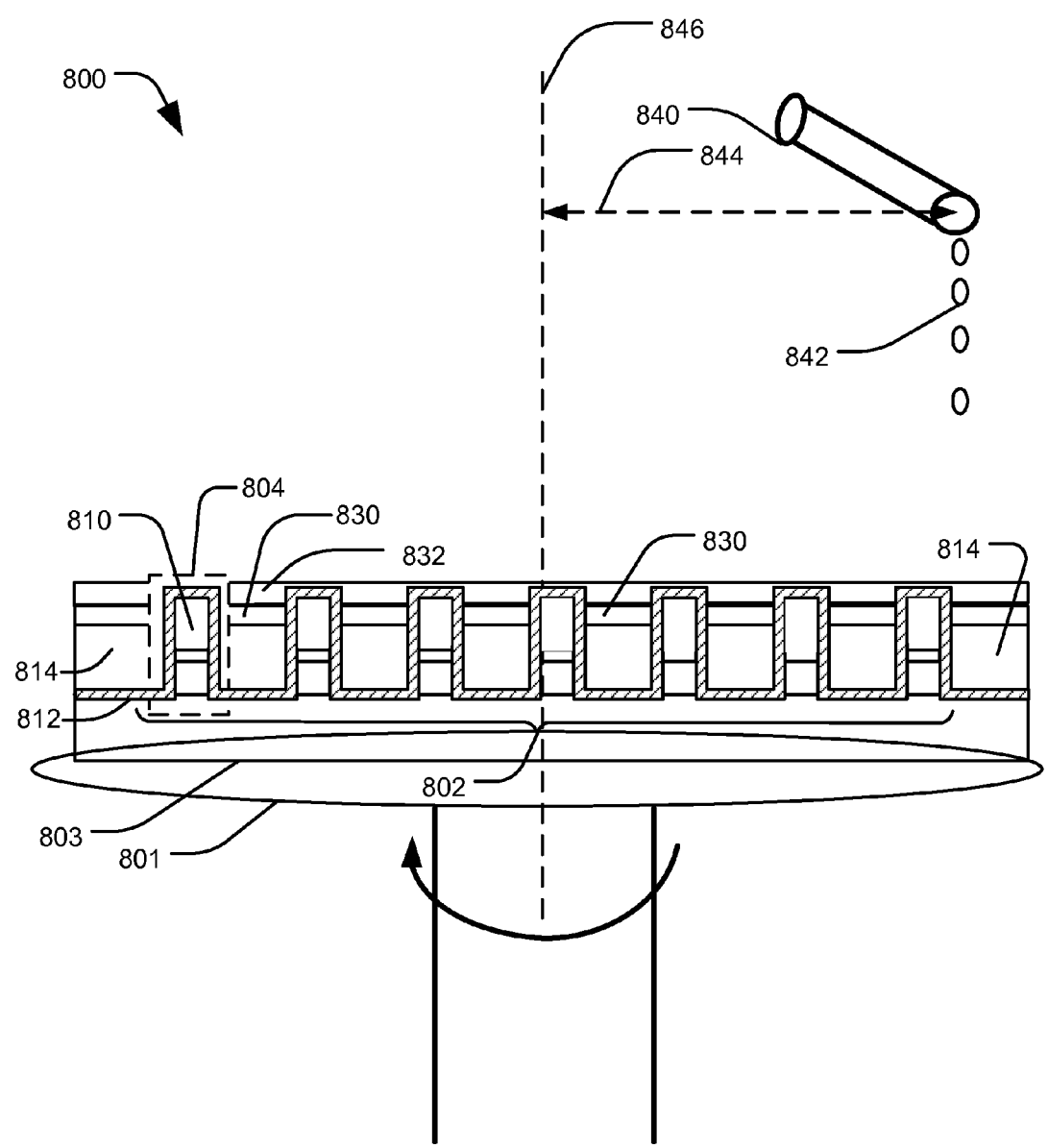
FIG. 8 is a cross-sectional diagram of a particular illustrative embodiment depicting deposition of a second spin-on material (SOM) layer of a magnetic random access memory during fabrication.

Referring to FIG. 8, a cross-sectional diagram of a particular illustrative embodiment depicting deposition of a second spin-on material (SOM) layer of a magnetic random access memory during fabrication is generally designated 800. An MRAM 802 in fabrication includes a plurality of MTJs, such as an MTJ 804. The MRAM 802 is fabricated on a substrate 803, which is disposed on a rotatable support structure 801. A SOM dispenser 840 may dispense SOM 842 onto a portion of the MRAM 802. The dispenser 840 may be positioned at a radial distance 844 with respect to an axis of rotation 846 of the rotatable support structure 801, and the radial distance 844 may be varied in time. The MRAM 802 includes a first layer of SOM 830 that has been previously deposited and etched, which covers and protects a cap layer 812 and an ILD layer 814, each of which surrounds each MTJ. Portions of the first layer of SOM 830 may have been removed through an etching process. The SOM 842 deposited on the MRAM 802 forms a second SOM layer 832, which further covers and protects the cap layer 812 and the ILD layer 814. In another particular illustrative embodiment, the first layer of SOM 830 may be stripped before second SOM 842 is deposited. The support structure 801 may have a selectable rotational speed that may be varied over time or may be substantially constant over time. The radial distance 844 of the dispenser may be changed over time with a constant radial speed profile or a non-linear radial speed profile.

The second SOM layer 832 may be deposited above the first SOM layer 830 with a selectable layer thickness profile. In a particular illustrative example, the radial speed profile of the dispenser 840 is non-linear and a profile of the resultant second SOM layer 832 deposited on the first SOM layer 830 may be convex or concave, depending on the radial speed profile of the dispenser 840 as the support structure 801 is rotated. In another particular illustrative example, the radial speed of the dispenser 840 is constant and the second SOM layer 832 will have an approximately constant thickness across the first SOM layer 830. The second SOM layer 832 may provide additional protection against a second etch procedure during fabrication of the MRAM 802.

Figure 9:
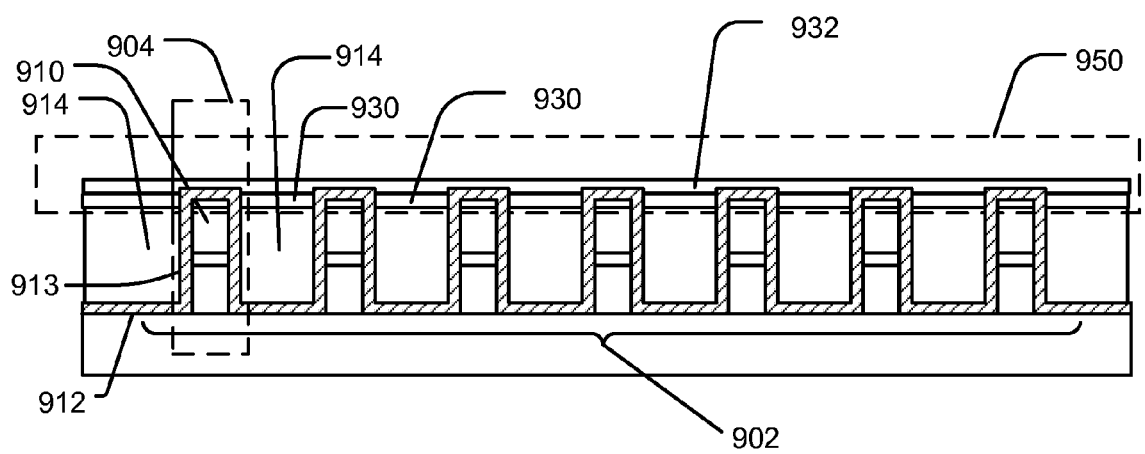
FIG. 9 is a cross-sectional diagram of a particular illustrative embodiment depicting etch of a second spin-on material layer and a cap layer of a magnetic random access memory in fabrication.

Referring to FIG. 9, a cross-sectional diagram of a particular illustrative embodiment depicting etch of a second spin-on material layer and a cap layer of a magnetic random access memory in fabrication is shown. An MRAM 902 including a plurality of MTJs, such as MTJ 904, is subjected to an etch procedure by immersing a portion of the MRAM 902 into an etching chamber 950. The MRAM 902 includes a second SOM layer 932 that has been previously deposited above a first SOM layer 930. The second SOM layer 932 provides additional protection to a cap layer 912 that may also be protected from the etching chamber 950 by the first SOM layer 930. The second SOM layer 932 and the first SOM layer 930 may also protect an ILD layer 914 during the etch procedure. By depositing multiple SOM layers on the MRAM 902 etching may be controlled so that an upper electrode contact layer portion of one of the MTJs, such as an upper electrode contact layer portion 910, may be exposed without etching a significant amount of the ILD layer 914 surrounding each MTJ. In a particular illustrative embodiment, etching may occur after each deposition of an SOM layer on the MRAM 902. By reducing etching of the ILD layer 914 that surrounds each MTJ, the ILD layer 914 may enhance structural integrity of the MRAM 902 by supporting sidewall portions 913 of the cap layer 912 that surround each MTJ. By adding the second SOM layer 932, MRAM device yield may be improved through a larger acceptable window of process parameters such as etch duration.

Figure 10:
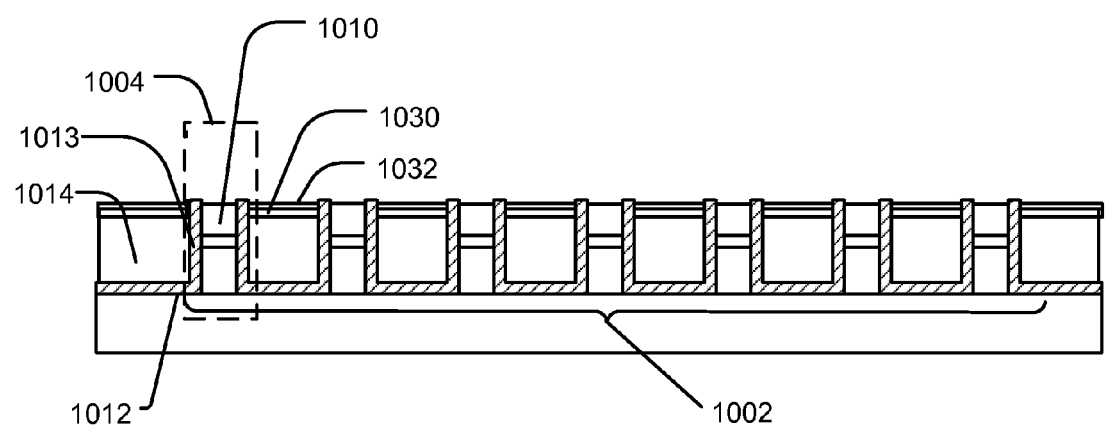
FIG. 10 is a cross-sectional diagram of a particular illustrative embodiment depicting a magnetic random access memory after etch of the second spin-on material layer, the first spin-on material and the cap layer during fabrication of the magnetic random access memory.

Referring to FIG. 10, a cross-sectional diagram of a particular illustrative embodiment depicting a magnetic random access memory (MRAM) after etch during fabrication of the magnetic random access memory is depicted. An MRAM 1002 has been subjected to one or more etch procedures and includes a first SOM layer 1030 and a second SOM layer 1032. An uppermost portion of a cap layer 1012 has been removed via the etch procedures, exposing a top electrode contact layer portion 1010. The upper electrode contact layer portion 1010 may be subsequently connected to an electrical contact layer (not shown). Sidewall portions of the cap layer 1012, including a sidewall portion 1013, have been protected from etching by the first SOM layer 1030 and the second SOM layer 1032. Portions of the first SOM layer 1030 and the second SOM layer 1032 have been removed. Remaining portions of the first SOM layer 1030 and the second SOM layer 1032 may protect the ILD layer 1014 that surrounds each MTJ, and the ILD layer 1014 may increase structural integrity of each MTJ. Through multiple SOM deposition-etching cycles that open the upper electrode contact layer portion 910, structural integrity of the MRAM 1002 may be improved and a manufacturing process window of process parameters, such as etch uniformity and selectivity, may be relaxed. Both structural integrity of the MRAM 1002 and an expanded manufacturing process window can enhance manufacturing yield.

Figure 11:
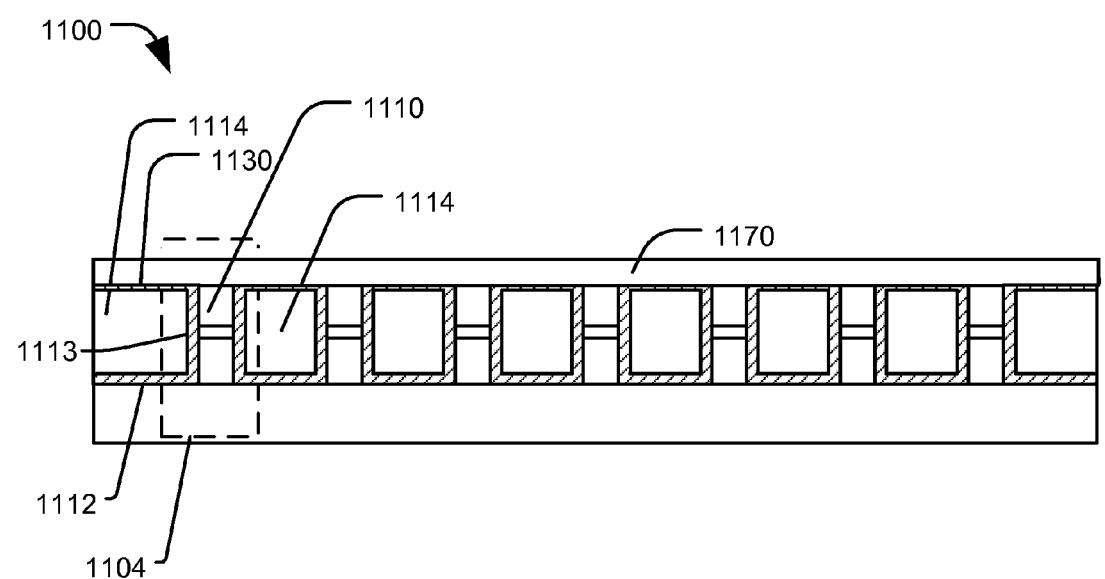
FIG. 11 is a cross-sectional diagram of a particular illustrative embodiment of a magnetic random access memory including a conducting layer in contact with corresponding contact electrodes of magnetic tunneling junctions of the magnetic random access memory in fabrication.

Referring to FIG. 11, a particular illustrative embodiment of a magnetic random access memory (MRAM) is depicted and generally designated 1100. An MRAM 1100 in fabrication, which includes a plurality of MTJs, such as MTJ 1104, has been subjected to etching, exposing a top electrode contact layer portion 1110. The top electrode contact layer portion 1110 is shown to be in contact with an electrical conducting layer 1170 that has been deposited subsequent to etching. A cap layer 1112 includes side wall portions such as a side wall portion 1113, which protects electrically active portions of the MTJ 1104. An SOM layer 1130 protects an ILD layer 1114 that surrounds each MTJ. The top electrode contact layer portion 1110 may be patterned to separate each MTJ from other MTJs. Each MTJ may be connected to the outside world via the electrical conducting layer 1170. By depositing one or more SOM layers 1130 that protect the ILD layer 1114 and protect portions of the cap layer 1112 such as the sidewall portion 1113 during etching, an MRAM manufacturing process parameter window may be increased and a greater yield may be achieved.

Figure 12:
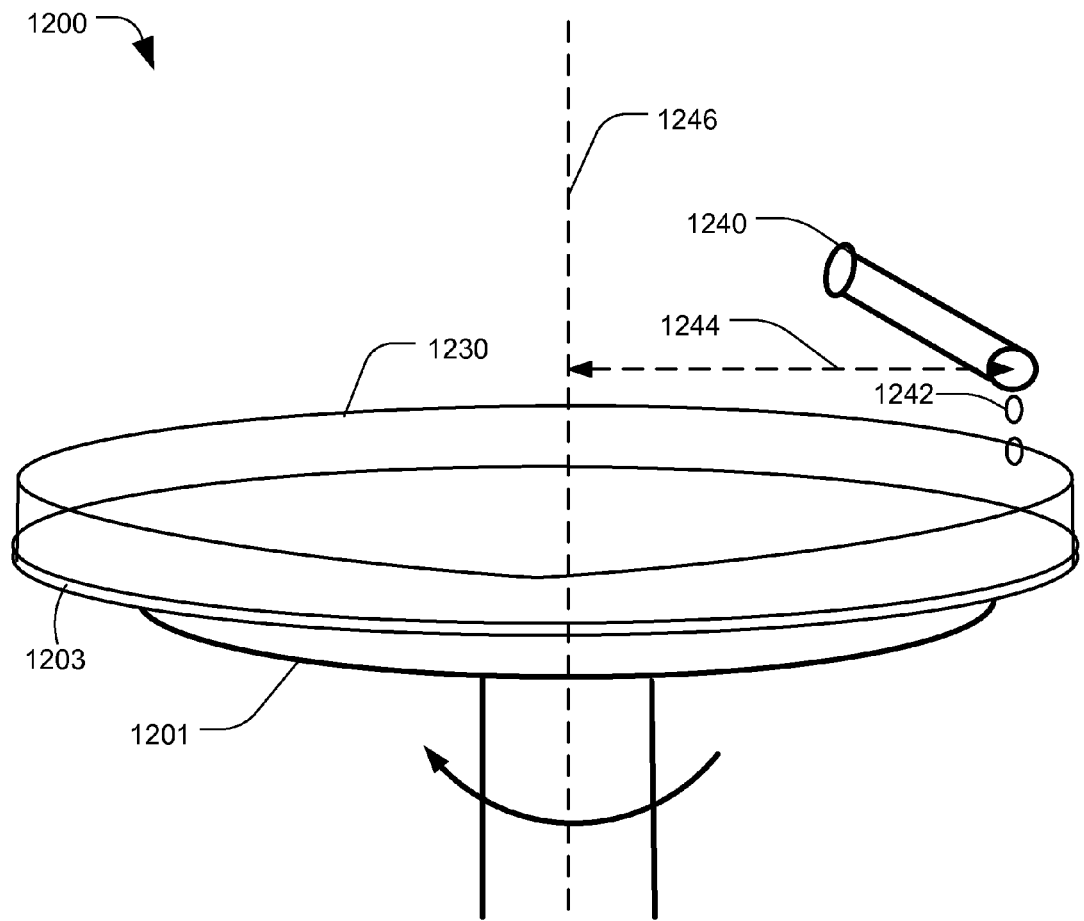
FIG. 12 is a diagram of a particular illustrative embodiment depicting non-uniform deposition of a spin-on material layer to fabricate a magnetic random access memory.
Figure 12:
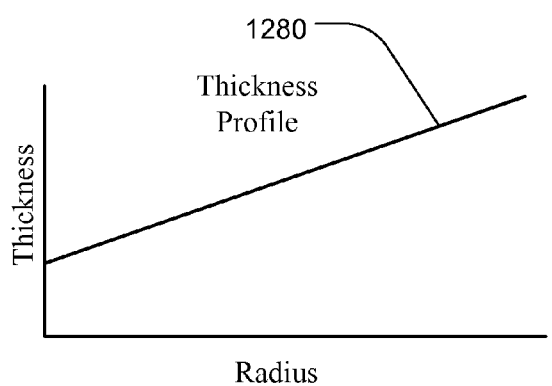

Referring to FIG. 12, a diagram of a particular illustrative embodiment depicting non-uniform deposition of a spin-on material layer to fabricate a magnetic random access memory (MRAM) is generally designated 1200. A substrate 1203 is disposed on a rotatable mounting structure 1201. The substrate 1203 has been partially patterned to form an MRAM including one or more MTJs such as the MTJ 404 of FIG. 4. An SOM dispenser 1240 may be positioned at an adjustable radial distance 1244 from an axis of rotation 1246 of the mounting structure 1201, and the radial distance 1244 may change over time. The dispenser 1240 may dispense SOM material 1242 that is deposited on the substrate 1201. A rate of dispensing SOM material through the dispenser 1240 may be selectable. In a particular illustrative embodiment, the dispensing rate may be selected to be substantially constant over time. In another particular illustrative embodiment, the dispensing rate may be selected to be variable over time. A rate of radial speed of the dispenser 1240 may be selectable. Through selection of a radial speed profile (radial distance over time) and selection of the dispensing rate of SOM liquid via the SOM dispenser 1240, a pre-determined thickness profile of a deposited SOM layer 1230 may be produced. In one particular non-limiting illustrative example, a uniform dispensing rate and a constant radial speed of the dispenser 1240 may result in a deposited SOM layer having a substantially constant thickness across the substrate 1201. In another particular illustrative example, a non-uniform dispensing rate of the SOM liquid 1242 and a uniform or non-uniform radial velocity profile of the dispenser 1240 may result in a non-uniform thickness profile of the SOM layer 1230. In yet another particular illustrative example, a uniform dispensing of the SOM liquid and a non-uniform radial velocity profile of the dispenser 1240 can result in a non-uniform thickness profile of the SOM layer 1230. The thickness profile may be constant, convex or concave, depending on factors that may include the dispensing rate profile of the SOM liquid and the radial speed profile of the dispenser 1240.

In a particular illustrative embodiment outer portions, i.e., circumferential portions of a substrate may experience greater etch rates than centermost portions, and a concave-shaped SOM layer 1230 shape may be advantageous during etching to protect outer portions of the substrate 1201 and on MRAM (not shown) in fabrication on the substrate 1201. In a particular illustrative example, a non-uniform SOM layer thickness profile 1280 may be employed to afford greater protection to circumferential portions of the substrate 1201 during an etching process. For instance, the SOM layer thickness profile 1280 shows thickness varying substantially linearly with a radial distance from a center of the substrate 1201, producing a concave-shaped SOM layer 1230. A non-uniform SOM thickness profile such as a concave shaped thickness profile may provide protection to outer portions of a MRAM structure in fabrication on a wafer against over-etching during fabrication of the MRAM. The non-uniform SOM thickness profile can compensate for substrate non-uniformity and make a top portion of each of the MTJ structures more uniform.

Figure 13:
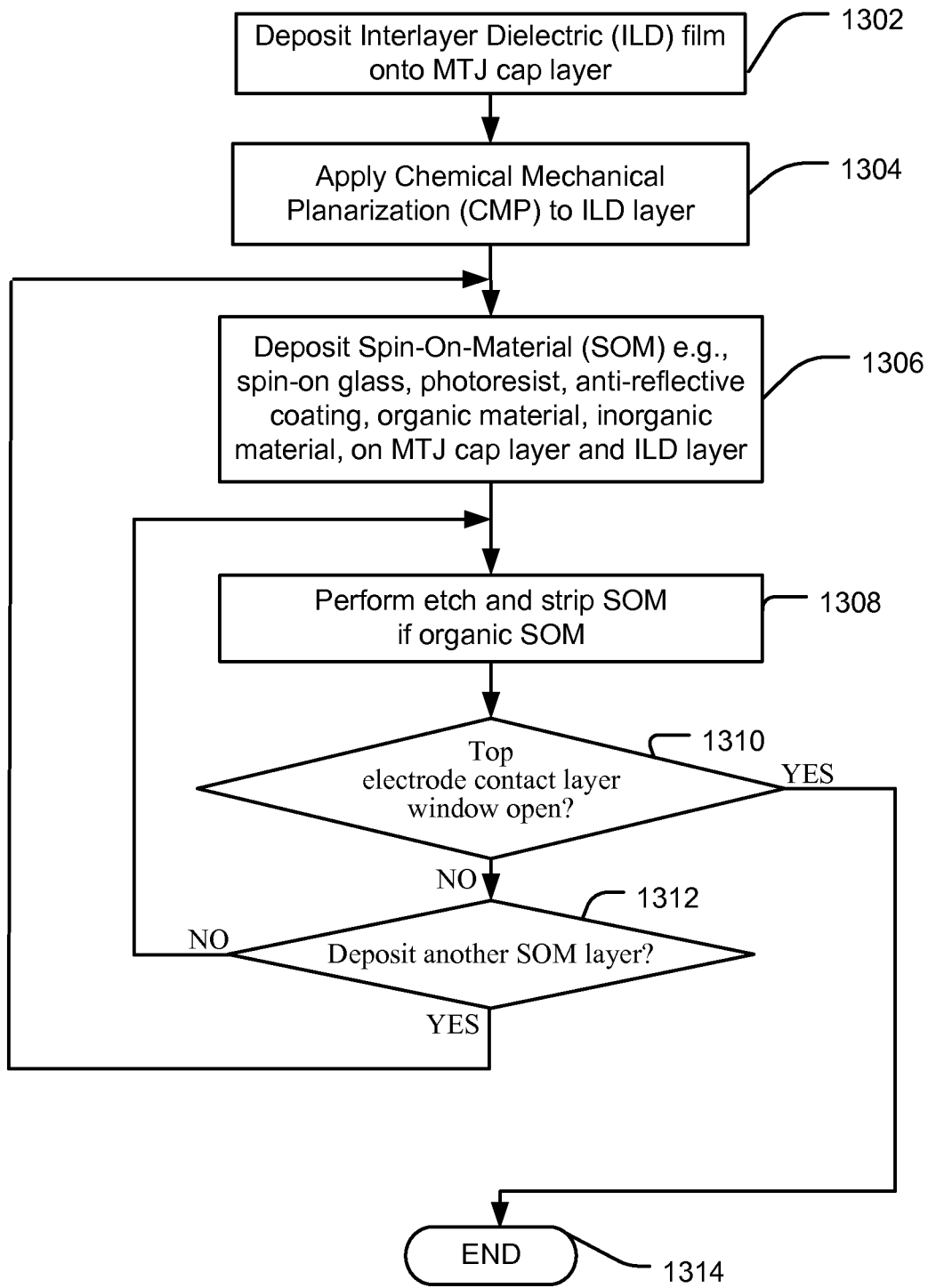
FIG. 13 is a flow chart of a particular illustrative embodiment of a method of fabricating a magnetic random access memory.

Referring to FIG. 13, a flow chart of a particular illustrative embodiment of a method of fabricating a magnetic random access memory is depicted. At block 1302, an interlayer dielectric (ILD) film is deposited onto a Magnetic Tunnel Junction (MTJ) cap layer of a Magnetic Random Access Memory (MRAM). Proceeding to block 1304, a chemical-mechanical planarization (CMP) process is applied to the ILD layer. Advancing to block 1306, a spin-on material (SOM), e.g., spin-on glass, photoresist, anti-reflective coating, organic material, or inorganic material, is deposited over the MTJ cap layer and the ILD layer, and may serve to protect the cap layer and the ILD layer during an etch procedure. (A densification heating process may also be applied if inorganic SOM materials are used.) Moving to block 1308, an etch procedure is performed, etching the SOM layer and portions of the cap layer that may become exposed. (If the SOM is organic material, the SOM may be stripped after etching.) Proceeding to decision block 1310, a determination is made as to whether a top electrode contact layer window (also "top electrode contact layer portion" herein) is open. When the top electrode contact layer window is open at each of the MTJs, the method terminates at 1314. When the top electrode contact window is not open at each of the MTJs, the method proceeds to decision block 1312, where a determination is made as to whether an additional SOM layer should be deposited to further protect the ILD and portions of the cap layer during a subsequent etch procedure. When the determination is made to deposit the additional SOM layer prior to the subsequent etch procedure, returning to block 1306 the additional SOM layer is deposited prior to the subsequent etch at block 1308. When it is determined, at block 1312, not to add another SOM layer, processing continues with an additional etch procedure performed on the previously deposited SOM layer and portions of the cap layer, at block 1308.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A magnetic random access memory (mRAM) device comprising:
   a magnetic tunnel junction (MTJ) structure;
   a cap layer in contact with the MTJ structure;
   a spin-on material layer in contact with a sidewall portion of the cap layer; and
   a conducting layer in contact with at least the spin-on material layer and a portion of the MTJ structure;
   wherein the cap layer has been etched to expose a portion of an electrode contact layer of
   the MTJ structure, and wherein the conducting layer is in electrical contact with the exposed portion of the electrode contact layer of the MTJ structure.

2. The mRAM device of claim 1, wherein the spin-on material layer comprises an inorganic material.

3. The mRAM device of claim 1, wherein the spin-on material layer comprises an organic material.

4. The mRAM device of claim 1, further comprising an interlayer dielectric (ILD) layer, wherein the ILD layer is situated between a portion of the cap layer and the spin-on material layer.

5. The mRAM device of claim 1, wherein prior to etching of the cap layer, the spin-on material layer covers a portion of the cap layer.

6. The mRAM device of claim 1, wherein prior to etching the spin-on material layer, a center thickness of the spin-on material layer differs from an outer thickness of the spin-on material layer.

7. A magnetic random access memory (mRAM) device comprising:
   a magnetic tunnel junction (MU) structure;
   a cap layer in contact with the MTJ structure; and
   a spin-on material layer in contact with the cap layer;
   wherein the device is formed by:
      depositing the cap layer on the MTJ structure;
      depositing the spin-on material layer over the cap layer; and
      etching the spin-on material layer and at least a portion of the cap layer.

8. The mRAM device of claim 7, further comprising an interlayer dielectric (ILD) layer, wherein the ILD layer is situated between a bottom portion of the cap layer and the spin-on material layer.

9. The mRAM device of claim 7, wherein the device is further formed by controlling a profile of the spin-on material so that a center thickness of the spin-on material layer differs from an outer thickness of the spin-on material layer.

10. The mRAM device of claim 9, wherein the profile of the spin-on material is convex.

11. The mRAM device of claim 9, wherein the profile of the spin-on material is concave.

12. The mRAM device of claim 7, wherein the spin-on material is one of spin-on glass, a photoresist material, and an organic anti-reflection coating (ARC) material.

13. A magnetic random access memory (mRAM) device comprising:
   a magnetic tunnel junction (MTJ) structure;
   a cap layer in contact with the MTJ structure; and
   a first spin-on material layer in contact with the cap layer;
   wherein the device is formed by:
   depositing the cap layer on the MTJ structure;
      selecting one of a convex profile and a concave profile of the first spin-on material layer;
      depositing the first spin-on material layer over the cap layer; and
      etching the first spin-on material layer and at least a portion of the cap layer.

14. The mRAM device of claim 13, wherein a center thickness of the first spin-on material layer differs from an outer thickness of the first spin-on material layer.

15. The mRAM device of claim 13, wherein the device is further formed by depositing a second spin-on material layer on the first spin-on material layer, wherein the second spin-on material layer is deposited with a selectable layer thickness profile.

16. The mRAM device of claim 15, wherein the device is further formed by stripping the first spin-on material layer before depositing the second spin-on material layer is deposited.

17. The mRAM device of claim 15, wherein the selectable layer thickness profile of the second spin-on material layer is a uniform profile that results in the second spin-on material layer having a substantially uniform thickness.

18. The mRAM device of claim 15, wherein the selectable layer thickness profile is a non-uniform profile that results in the second spin-on material layer having a non-uniform thickness.

19. The mRAM device of claim 18, wherein the non-uniform profile is one of a concave-shaped profile and a convex-shaped profile.

20. The mRAM device of claim 15, wherein the second spin-on material is one of spin-on glass, a photoresist material, and an organic anti-reflection coating (ARC) material.

21. A magnetic random access memory (mRAM) device comprising:
   a magnetic tunnel junction (MU) structure;
   a cap layer in contact with the MTJ structure; and
   means for protecting sidewall portions of the cap layer during an etching process;
   wherein prior to the etching process, a profile of the means for protecting sidewall portions of the cap layer is controlled.

22. The mRAM device of claim 21, wherein the profile of the means of protecting sidewall portions of the cap layer is controlled so that a center thickness of a deposited layer differs from an outer thickness of the deposited layer.

23. A magnetic random access memory (mRAM) device comprising:
   a magnetic tunnel junction (MTJ) structure;
   a cap layer in contact with the MTJ structure; and
   a first spin-on material layer in contact with the cap layer;
   wherein the device is formed by:
      a first step for depositing the cap layer on the MTJ structure;
      a second step for selecting one of a convex profile and a concave profile of the first spin-on material layer;
      a third step for depositing the first spin-on material layer over the cap layer; and
      a fourth step for etching the first spin-on material layer and at least a portion of the cap layer.

24. The mRAM device of claim 23, wherein the first step, the second step, and the third step are performed by a processor integrated into an electronic device.

* * * * *